United States Patent [19]
Hastings et al.

[11] Patent Number: 5,933,034
[45] Date of Patent: Aug. 3, 1999

[54] HIGH SPEED BICMOS GATE DRIVER FOR MOSFETS INCORPORATING IMPROVED INJECTION IMMUNITY

[75] Inventors: Roy A. Hastings, Allen; Nicolas Salamina, Sachse, both of Tex.

[73] Assignee: Texas Instruments Incorporated, Dallas, Tex.

[21] Appl. No.: 08/806,369

[22] Filed: Feb. 27, 1997

Related U.S. Application Data

[60] Provisional application No. 60/012,658, Mar. 1, 1996.
[51] Int. Cl.$^6$ ....................................................... H03K 3/00
[52] U.S. Cl. .............................. 327/108; 327/433; 326/84
[58] Field of Search ................... 327/108–112, 374–377, 327/432, 433; 326/84

[56] References Cited

U.S. PATENT DOCUMENTS

| | | | |
|---|---|---|---|
| 4,906,868 | 3/1990 | Maki et al. | 326/110 |
| 5,121,011 | 6/1992 | Ohya et al. | 327/432 |

*Primary Examiner*—Kenneth B. Wells
*Attorney, Agent, or Firm*—Christopher L. Maginniss; W. James Brady, III; Richard L. Donaldson

[57] ABSTRACT

A circuit and method for implementing a MOSFET gate driver. Two bipolar NPN transistors (Q1, Q2), constructed to achieve rail-to-rail swings when driving a capacitive load (23) by overlapping their respective emitter regions (13) over their contained contact regions (19) to prolong internal device saturation and resulting turn-off delays, alternately connect the gate drive terminal (31) to either a supply terminal (HVDC) or an output terminal (29). Predrive circuitry for these transistors comprises NMOS transistors (M9, M18, M12 and M13). The NPN transistors are supplemented by a CMOS inverter (PMOS transistor M6 and NMOS transistor M17). A PMOS transistor (M7) provides additional base drive for transistor Q1 when the gate drive node is approaching the supply node. A diode (D2) protects transistor Q1 against base-emitter avalanche and protects transistor M7 from excessive drain-to-source voltages. The circuit can tolerate negative voltages up to approximately two diode drops on its output and gate drive terminals because (a) when transistor Q2 is conducting it is effectively configured as an NPN diode and the collector cannot sustain a voltage less than one base-emitter drop above its emitter, (b) transistor M13 is a DMOS transistor which can withstand negative voltages upon its source when it is nonconducting due to the interposition of the backgate between the source and the drain and (c) transistors M17 and M18 are returned to ground and not to the output terminal.

12 Claims, 2 Drawing Sheets

HIGH SPEED BICMOS GATE DRIVER FOR MOSFETS INCORPORATING IMPROVED INJECTION IMMUNITY This application claims priority under 35 USC § 119(e)(1) of provisional application number 60/012,658 filed Mar. 1, 1996.

BACKGROUND OF THE INVENTION

1. Field of the Invention

This invention relates to a high speed biCMOS gate driver for use in conjunction with power MOSFETs.

2. Brief Description of the Prior Art

In order to minimize switching losses in switched-mode power converters, the power MOSFET transistors must be switched on and off very rapidly. The gate drive signal must respond or slew at nearly $10^9$ volts/second in order to achieve state of the art performance. Since the equivalent gate capacitance of a power FET is typically several hundred picofarads, peak currents of 500 milliamperes to several amperes are required to generate the necessary slew rates. These currents are driven for intervals of less than 50 nanoseconds with very low duty cycles. To obtain high efficiency, the gate driver circuit should consume little or no standby current. Driver circuits for this type of application have been very difficult to design. Existing implementations use either pure bipolar or pure CMOS outputs. Pure bipolar circuits are plagued by shoot-through currents which are currents that occur when both the upper and lower switches in a totem-pole output are on at the same time due to overlaps in the switching waveforms and require excessive standby supply current. Shoot-through currents are very difficult to eliminate in bipolar gate drivers. CMOS drivers have poor current drive capability relative to the die area they consume.

Some drive configurations, particularly the bootstrap configuration widely used to drive power NMOS transistors in a high-side-drive (HSD) configuration, subject the gate lead to voltages one diode drop below ground. The standard BiCMOS driver has insufficient immunity to substrate injection to handle this application, but by use of appropriately placed diodes and by reconnecting the power supplies in a novel manner, a BiCMOS driver with superior immunity to substrate injection can be formed, substrate injection being the injection of minority carriers from a forward biased N-type diffusion to the P-type substrate. A typical prior art driver with bootstrap configuration is shown on page 271 of *Analog Circuit Design,* Edited by Rudy J. Van DePlassche et al., Kluwer Academic Publishers, 1995. Prior art biCMOS gate driver circuits exist which overcome the limitation of pure CMOS or pure bipolar gate drivers.

SUMMARY OF THE INVENTION

In accordance with the present invention, the above described problems inherent in the prior art are minimized.

BiCMOS circuits allow NPN transistors to be used as output devices within the driver circuit whereas MOSFET transistors can be used to provide base drive to the NPN transistors. This combination provides a solution to driving power MOSFET gates. The structure of the NPN transistors can be designed to take advantage of charge storage effects to provide rail-to-rail swings at the output.

By applying the BiCMOS techniques known to digital logic design, a highly efficient driver is provided. The properties of NPN transistors are exploited in a novel manner to improve the performance of the gate even further. By a novel arrangement of the output stage components and incorporation of selective diode drops, the output driver is also made immune to small negative voltage potentials. This allows application of the driver in circuits where existing drivers cannot be used, such as bootstrap configurations. Advantages derived by the present invention are high output drive with small amounts of die area, rail-to-rail swing without constant current drain from the supply, inherent robustness of the NPN output stage as compared with MOS and, most importantly, tolerance of negative output voltages up to about 2 $V_{be}$.

Briefly, the above is accomplished by providing a gate driver which comprises a first bipolar transistor having a first current path and a first control electrode and a second bipolar transistor having a second current path and a second control electrode. The current paths of the first and second transistors are serially connectable across a voltage source. A gate drive output terminal is coupled to the junction of the first and second current paths and a diode is coupled between the gate drive output terminal and the control electrode of the first transistor to prevent zenering of the first transistor. MOS circuitry controls the bipolar transistors. The MOS circuitry and bipolar transistors are preferably disposed on a single chip.

The invention also includes, either alone or as the bipolar transistors of the gate driver, a transistor which comprises emitter, base and collector regions and an oxide layer disposed over a part of the emitter region having a contact region therein extending to the emitter region. The contact region is so drawn that the overlap of the emitter over the contact is substantially greater than the minimum allowed by the design rules. The contact region and the emitter region are preferably rectangular in shape.

More specifically, the two bipolar NPN transistors are constructed to achieve rail-to-rail swings when driving a capacitive load by overlapping their respective emitter regions over their contained contact regions to prolong internal device saturation and resulting turn-off delays and alternately connecting the gate drive terminal to either a supply terminal or an output terminal. Predrive circuitry for these NPN transistors comprises NMOS transistors. The NPN transistors are supplemented by a CMOS inverter. A PMOS transistor provides additional base drive for one of the NPN transistors when the gate drive node is approaching the supply node. A diode protects that NPN transistor against base-emitter avalanche and protects the added PMOS transistor from excessive drain-to-source voltages. The circuit can tolerate negative voltages up to approximately two diode drops on its output and gate drive terminals because (a) when transistor Q2 is conducting it is effectively configured as an NPN diode and the collector cannot sustain a voltage less than one base-emitter drop above its emitter, (b) predrive circuit transistor M13 is a DMOS transistor which can withstand negative voltages upon its source when it is nonconducting due to the interposition of the backgate between the source and the drain and (c) transistors M17 and M18 are returned to ground and not to the output terminal. Transistors M6 and M7 may be high transconductance devices constructed using thin gate oxide because the configuration of this circuit prevents excessive drain-to-source voltages from appearing across these devices.

DESCRIPTION OF THE PREFERRED EMBODIMENT

Figure 1:
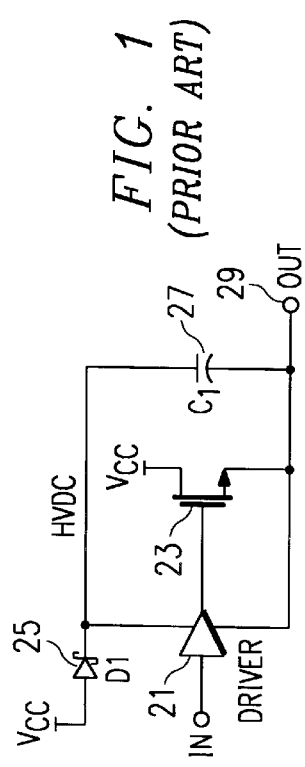
FIG. 1 is a circuit diagram of a typical prior art driver circuit including bootstrapping.

Referring first to FIG. 1, there is shown a typical prior art driver circuit 21 including bootstrapping. The output of the driver circuit 21 drives a power FET 23 which drives the output lead 29 from supply lead $V_{cc}$. Schottky diode 25 and capacitor 27 are generally components external to the driver circuit and provide a charge pump which stores charge on capacitor 27 to feed the driver 21 so that the gate of transistor 23 can be pulled above $V_{cc}$. In standard circuits of the type described in FIG. 1, if $V_{cc}$ is greater than about 15 volts, the gate oxide of transistor 23 may break down. However, if the anode of diode 25 is connected to a voltage generally equal to or less than about 15 volts, then even if the drain potential of NMOS transistor 23 is greater than 15 volts, the problem can be eliminated. Diode 25 can be integrated onto the same substrate as the driver circuit. This scheme drives the gate of transistor 23 with a voltage referenced to the source of transistor 23, which is desirable since it ensures that device turn on is controlled and $V_{gs(max)}$ is never transiently exceeded. The drawbacks of such a scheme as shown in FIG. 1 are (1) when used to drive a buck converter or similar load, the output lead can go approximately 0.7 to 0.8 volts below ground, this causing a potential substrate injection hazard and (2) $V_{cc}$ being about 30 volts and $V_{gs}$ being about 15 volts leads to a $V_{HVDC}$ of about 45 volts, which is beyond the voltage capabilities of many semiconductor fabrication processes.

Figure 2:
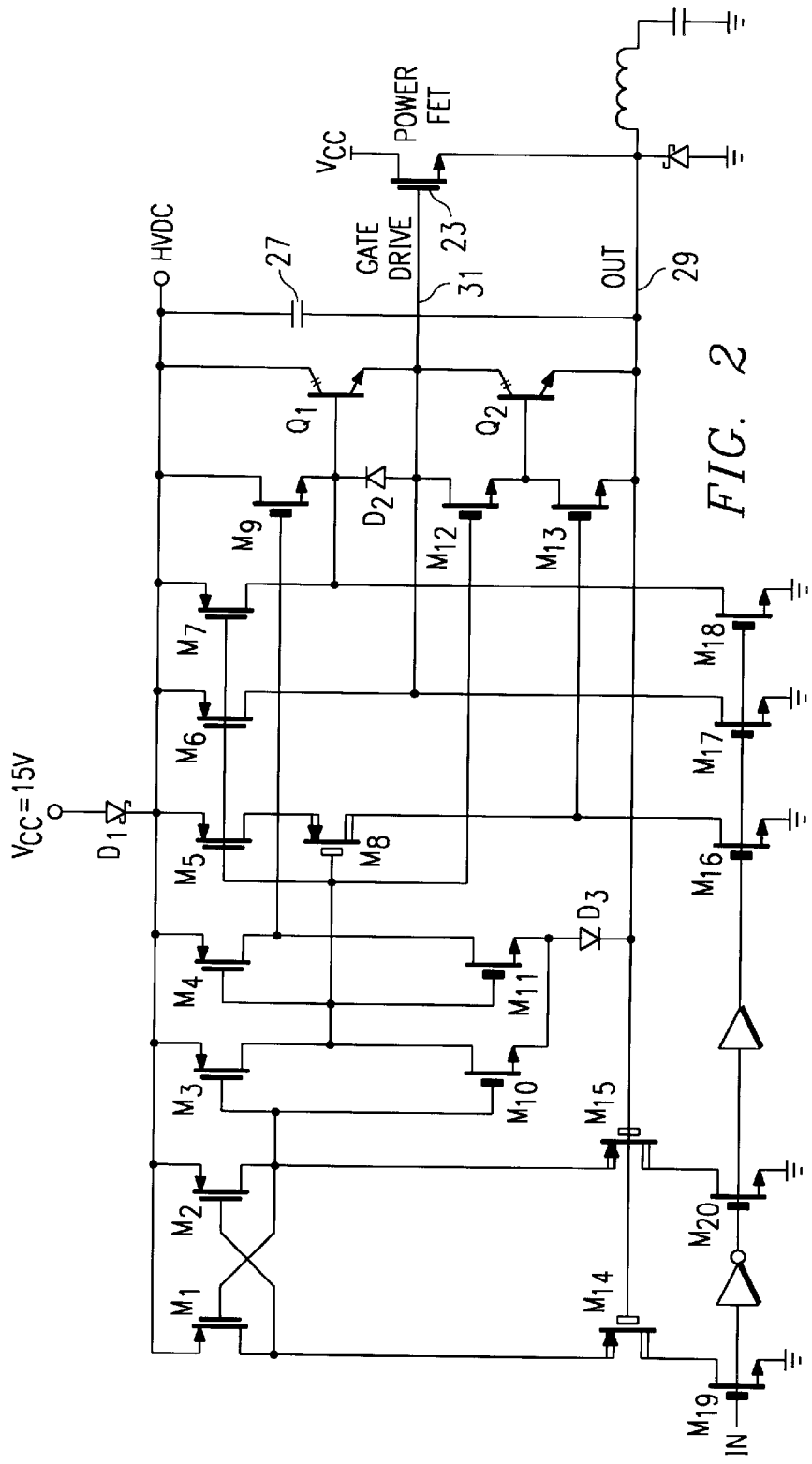
FIG. 2 is a circuit diagram of a driver circuit in accordance with the present invention which can replace the driver circuit 21 of FIG. 1.

Referring to FIG. 2, there is shown a circuit as in FIG. 1 but with a driver circuit in accordance with the present invention replacing the driver circuit of the prior art. A major purpose of the invention is to provide a driver which is tolerant to an output voltage down to about minus 0.7 volts (−0.7 V) in addition to the other standard desires for such circuits.

The basic driver includes DMOS transistors M12 and M13 which drive NPN transistor Q2. Transistor Q2 is designed to have a deep N+ collector region which touches the N+ buried layer (NBL). DMOS transistors M9 and M18 drive NPN transistor Q1 which has the same characteristics as transistor Q2. Transistor M12 is connected to the gate drive terminal rather than to the power supply because when the gate drive is on, the gate drive terminal is at a higher voltage than the output terminal. Therefore, if transistor M12 is turned on by applying an appropriate voltage to the gate thereof while transistor M13 is off, a large current is applied to the base of transistor Q2 and turns on transistor Q2. The major reasons for this connection are (a) the power is taken from the gate drive terminal, not from the supply, thereby saving power and (b) when the gate drive terminal is pulled down, the current stops flowing, transistor M12 conduction reverses and the base of transistor Q2 is pulled down so that the stored charge is dissipated.

The voltage on the base of transistor Q2 now begins to drop, the voltage on the gate drive terminal approaches the voltage on the output terminal and transistor Q2 begins to saturate. Transistor M12 finally has insufficient voltage thereacross to provide base drive to transistor Q2. Finally, transistor Q2 saturates, stored charge therein accumulates and the base drive for transistor Q2 is lost. The gate of transistor Q2 is pulled to ground as the base drive thereto reverses. The reversed base drive pulls out stored charge from transistor Q2 and turns transistor Q2 off. This provides two important benefits. First, transistor Q2 is now off when transistor Q1 is turned on, this having been a problem in the bipolar transistor prior art. Second, since transistor Q2 is off, it draws almost no supply current, requiring current only for transitions and is therefore a zero current circuit for DC. The result is that transistor Q2 remains on only long enough to discharge the gate load, which is assumed to be capacitive in nature. Transistor M13 is not required to extract stored base charge from transistor Q2, since this role is performed by transistor M12. Transistor M13 can therefore be a relatively small device.

As can be seen, transistors M9 and M18 are connected differently with respect to transistor Q1 than are transistors M12 and M13 with respect to transistor Q2. More specifically, the base of transistor Q1 is connected directly to ground via transistor M18 rather than to the gate drive terminal and, instead, a diode D2 is provided between the gate drive terminal and the base of transistor Q1. Transistors M12 and M13 are connected differently with respect to transistor Q2 than are transistors M18 and M9 connected with respect to transistor Q1 due to the properties of a DMOS transistor, transistors M12, M13 and M18 being DMOS transistors. The reason is that transistor M18 would typically be on when the voltage on the output terminal goes below ground. Therefore, if the source of transistor M18 were connected to the output terminal, the drain voltage of this transistor could be pulled below ground and electrons could be injected into the substrate. Transistor M13 is off during this period of time, so the backgate-drain junction of this transistor can block negative voltages and so prevent substrate injection.

The large voltage is handled by sizing transistor M18 small and sizing diode connected NPN transistor D2 large. In this way, diode D2 overwhelms the transistor M18 so that the voltage on the drain of transistor M18 cannot go much below the voltage on the gate drive lead, thereby preventing the base-emitter junction of transistor Q1 from being avalanched. Avalanching transistor Q1 will reduce its beta and will therefore impair circuit operation. The current passing through diode D2 and transistor M18 is helping to pull down the voltage on the base of transistor Q1 and that is what is desired when transistor M18 is turned on. This turns off transistor Q1.

Transistors M6 and M17 operate as an inverter. In operation, once both transistors Q1 and Q2 turn off, there is nothing controlling the voltage of the gate drive terminal. Leakage currents can potentially cause the gate lead to drift away from the rails. Transistors M6 and M17 retain the gate drive terminal substantially at its end state, either HVDC or ground, once this state has been reached. Transistors M5, M8 and M16 are predrivers to transistor M13.

Transistor M7 is protected against excessive drain-to-source and drain-to-gate voltages by diode D2 which is much stronger than transistor M18 so the drain of transistor 18 cannot pull to ground but rather only slightly below the voltage on the gate drive terminal. Since there is a capacitor between the output terminal and the HVDC terminal, the same as shown in FIG. 1, the voltage on the HVDC terminal will not immediately change much with respect to the voltage on the output terminal. The output terminal (OUT) is connected to the gate drive terminal through the power FET, which acts as a source follower. Therefore the gate drive terminal voltage follows the voltage on the output terminal. If the gate drive terminal is pulled down, the source of the power FET follows to maintain current flow through the power FET. Accordingly, upon turn off, the voltage on each of the HVDC terminal, the gate drive terminal and the output terminal all drop off together. Therefore, transistor M7 is never overstressed and can be a low voltage transistor. The same reasoning applies to transistor M6 since it is coupled to the gate drive terminal. Transistor M5 is not so protected, however it has a low current path because it merely drives the predriver M13 to transistor Q2. Transistor M5 is therefore cascoded with transistor M8 which has a high voltage capability to take any high voltage stress away from transistor M5.

A principal reason for avoiding cascodes is that the high voltage transistor must be very large to obtain sufficient transconductance. Cascode devices have a thick gate oxide in order to withstand high voltages and thus have relatively low transconductance per unit area. If a high voltage PMOS transistor is available which has a sufficiently high threshold voltage, transistor M5 can be eliminated and the source of transistor M8 can be connected to HVDC. It follows that transistors M5, M6 and M7 in accordance with the present invention can be low voltage PMOS devices to achieve high transconductance and, at the same time, occupy a small area. In addition, transistor M5 protects transistor M8 against leaking since transistor M8 is subject to leakage problems, having a relatively low $V_t$.

High voltage MOS transistors M3 and M4 and DMOS transistors M10 and M11 are parts of two inverters that drive the following circuitry. Normally these inverters would be returned to the output terminal. This cannot be done because transistor M11 is on when the output terminal is low. This problem is corrected by the addition of a diode-connected NPN transistor D3 between the common sources of transistors M10 and M11 and the output terminal. The cathode of diode D3 is the emitter of an NPN transistor, while the anode of diode D3 consists of the collector and base of the NPN transistor connected together. Therefore, the cathode of diode D3 is biased one $V_{be}$ below the anode when the diode conducts. In order for the anode of the diode to go one diode drop below the substrate, the cathode of the diode must be pulled to a potential one base-emitter drop lower. This provides approximately an additional 0.7 volt margin before substrate injection occurs. Transistors M1, M2, M14, M15, M19 and M20 are a level shifter. Transistors M14 and M15 act as cascode devices to transistors M1 and M2.

Substrate injection protection is provided by taking advantage of the fact that a DMOS transistor, when off, blocks the reverse voltage. Those NMOS transistors which must conduct when the OUT terminal goes negative can be protected by reconfiguring the circuit so that their sources go to ground. The additional voltage stresses on transistors M5, M6 and M7 can be tolerated due to the design considerations previously discussed for these devices.

Transistors M1 and M2 are a cross-connected latch used as a level shifter. Transistors M14 and M15 are added as cascodes. If a high voltage PMOS transistor is available which exhibits a sufficiently high threshold voltage, cascodes M14 and M15 can be eliminated and transistors M1 and M2 can be made using those high voltage-high $V_t$ PMOS transistors. Diode D3 insures that the load driver can be turned off by the level shifter.

Transistors M3/M10 and transistors M4/M11 are inverter predrivers giving counterphased drive signals to the output driver. Diode connected NPN transistor D3 insures that the substrate injector is minimal as has been previously discussed.

Transistors M9 and Q1 form the upper driver for the output. Transistor M11 can turn off transistor M9 because the drop of diode D3 is counterbalanced by the drop of transistor Q1. Diode D2 prevents avalanching of the base-emitter junction of transistor Q1 during turnoff (which would degrade the beta of transistor Q1).

Transistor M18 turns off transistor Q1. Because of diode D2, the drain-to-source voltage of transistor M7 is limited since diode D2 clamps the drain of transistor M7 one $V_{be}$ below the gate drive terminal which must be above the voltage of the output terminal which, in turn, cannot be more than about 15 volts below the HVDC terminal. Transistor M7 is a final pullup for transistor Q1 which continues to drive transistor Q1 when transistor M9 loses headroom. A similar device (not shown) can be used in conjunction with transistor Q2.

Transistors M6/M17 are an inverter which serves as a final pullup/pulldown for the gate drive terminal, to prevent leakages or small resistive loads from causing the output to drift away from either power supply rail. Transistor M6 is protected against breakdown by being connected to the gate drive terminal, which will always be above the voltage of the output terminal when the gate driver is used as a part of a buck converter or similar application.

Transistors M12 and Q2 are the pull down for the output terminal. Transistor M12 takes its drive from the gate drive terminal, not from the HVDC terminal, to eliminate standby current. Even though transistor Q2 loses base drive as the gate drive lead is pulled down, saturation insures that the gate capacitance is fully discharged. Transistor M17 then prevents leakages from causing the gate drive lead to float above the output lead. Transistor M13 is the turnoff for transistor Q2. Transistor Q2 is not a substrate injection hazard because the connection of transistor M12 is such that its collector is always one $V_{be}$ above the output terminal voltage. Transistor M13 is not a hazard because it is off when the negative voltage is seen and the DMOS can be laid out so that the source is isolated from the tank by the DMOS backgate, this being the usual layout therefor.

Transistor M13 is turned off by transistor M16. However, this connection prohibits a low voltage device from being used for turn-on. Instead, a high voltage, low-threshold PMOS transistor M8 is used as a cascode device for a low voltage, high-threshold voltage PMOS transistor M5. This structure could be eliminated were a HVPMOS transistor which did not leak to be used.

The reason for using NPN transistors is that NPN transistors are very rugged and are capable of very high power levels compared with other available semiconductor components.

Figure 3:
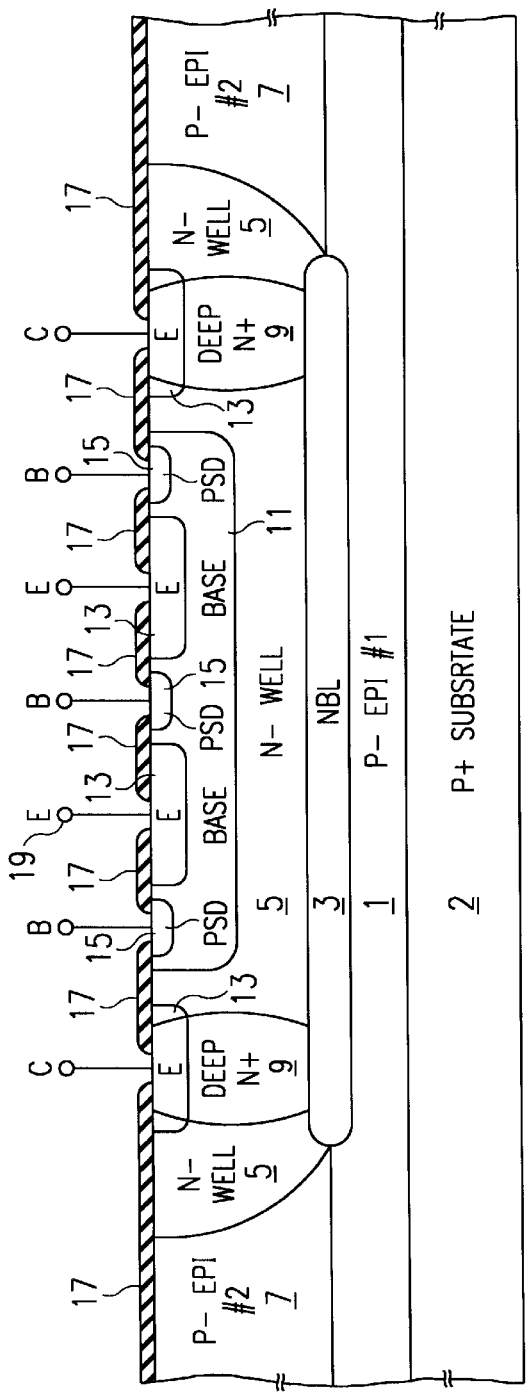
FIG. 3 is a cross-section of an NPN transistor laid out in accordance with the present invention.
Figure 4:
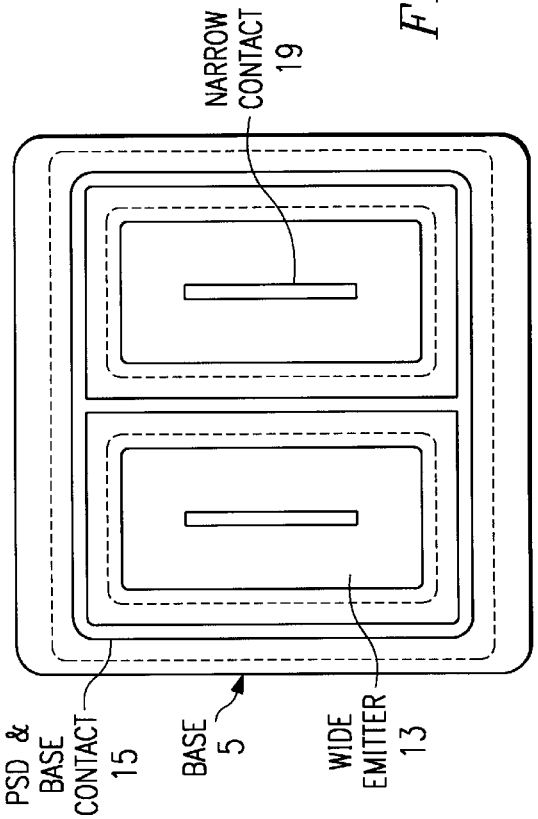
FIG. 4 is a top view of an NPN transistor laid out in accordance with the present invention.

A typical collector-diffused isolation NPN transistor of the type utilized as transistor Q1 or Q2 herein is shown in FIGS. 3 and 4 and includes a P-type epitaxial region 1, generally over a P+ type substrate 2. An N+ buried layer or region (NBL) 3 is disposed over a portion of the P-type region 1 and an N-type well 5 is disposed over the NBL region 3 with P-type epitaxial regions 7 providing isolation around the well 5 and contacting the p-type region 1. An N+ type deep collector region 9 is formed in the well 5 and extends to the NBL region 3. A further shallow relative to the collector P-type base region 11 is disposed in the well 5 and spaced from the collector region 9 with an N+ emitter region 13 formed within the base region. A P+ type base contact region 15 is formed in portions of the base region 11. An oxide layer 17 is then formed over the entire surface and contact openings are formed therein, exposing the emitter regions 13 (those with deep N+ collector region 9 therethrough being collector regions), base contact regions 15 and emitter region 13 which is the emitter of the NPN transistor with narrow contact region 19.

The above described transistor is formed by growing the epitaxial layer 1 on the substrate 2, and then forming the N-type buried layer 3 on the layer 1. The P-type epitaxial layer 7 is then grown over the layer 3 and exposed portion of the layer 1. The N-well 5 is then diffused into the layer 7 after patterning and the deep collector regions 9 are then formed in the N-well 5 after a further patterning and diffusion. The base region 11 is then formed after a further patterning and diffusion. The P-type base contacts 15 are then formed after another patterning and diffusion. The emitter regions 13 are then formed in the well 5 after a further patterning and diffusion. The oxide layer 17 is formed by thermal oxidation and/or chemical vapor deposition (CVD), then patterned to form contacts. All of the steps described above are standard and well known in and of themselves. However, an important novel feature is the fact that the NPN transistor has a narrow emitter contact area 19 having a width of about 2 microns and a wide emitter structure 13 having a width of from about 10 to about 18 microns as shown in FIG. 4, this feature increasing the base spreading resistance and thus lengthening the storage delays while simultaneously providing emitter ballasting. While specific dimensions are provided in conjunction with the preferred embodiment, it should be understood that the above-described improvements are obtained by using a larger than minimum overlap of the emitter over the emitter contact, the exact spacings of which must be optimized for any given process. Although the transistor construction has been described in terms of a collector-diffused isolation process, the same advantages can be obtained by an analogous consideration applied to other processes and styles of layout.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A gate driver comprising:
   (a) a first NPN transistor having emitter, base and collector regions, wherein a supply source is connected to said collector region of said first NPN transistor, gate drive circuitry is connected to said emitter region of said first NPN transistor, and predrive circuitry is connected to said base region of said first NPN transistor and operable to turn said first transistor on or off in response to a signal at a control terminal; and
   (b) a second NPN transistor having emitter, collector and base regions, wherein the collector region of said second NPN transistor is connected to the emitter region of said first NPN transistor, the emitter region of said second NPN transistor is directly connected to an output terminal, and the base region of said second NPN transistor is connected to said predrive circuitry operable to turn said second NPN transistor on or off in response to the signal at said control terminal.

2. The gate driver of claim 1, further comprising a first diode having an anode and a cathode, the cathode of said first diode connected to the base region of said first NPN transistor and the anode of said first diode connected to the emitter region of said first NPN transistor, said first diode limiting the reverse voltage across the junction of said base and emitter regions of said first NPN transistor to a value less than the avalanche voltage of said junction.

3. The gate driver of claim 2 wherein said first and second NPN transistors each comprise:
   (a) an insulating layer disposed over a part of said emitter region having a contact region with a periphery therein extending to said emitter region;
   (b) said emitter region overlapping said contact region at all points about the periphery of said contact region to a distance substantially greater than the minimum allowed by photolithographic considerations; said distance chosen to ensure that the turn-off delay of said transistors exceeds the conduction interval required to completely charge or discharge a capacitive load of known and finite value connected to said gate drive circuitry.

4. The gate driver of claim 3 wherein said collector regions are each defined by a semiconductor region which is lightly doped relative to said emitter region, said base region is defined by a portion of said region defining said collector region which has been selectively counterdoped and said emitter region is defined by a portion of said portion of said region defining said collector region which has been further counterdoped relative to said base region counterdoping.

5. The gate driver of claim 4 wherein said collector regions are N-type semiconductor regions, said base regions are P-type and said emitter regions are N-type to form an NPN transistor, further including a P-type isolation region surrounding each said collector region and biased to reference potential to isolate said transistors from other components.

6. The gate driver of claim 2 wherein said predrive circuitry connected to the base of said second NPN transistor comprises first and second NMOS transistors, the drain of said first NMOS transistor connected to said gate drive terminal, the source of said first NMOS transistor connecting to the drain of said second NMOS transistor and the base of said second NPN transistor, and the source of said second NMOS transistor connecting to said output terminal, the gates of said first and second NMOS transistors connected to circuitry operable to either turn on or turn off said second bipolar transistor in response to the signal at said control terminal.

7. The gate driver of claim 6 wherein said second NMOS transistor is a double diffused MOS transistor (DMOS), said DMOS transistor operable to block a negative bias place upon the source of said second DMOS transistor from reaching the drain of said second DMOS transistor when said second DMOS transistor is nonconducting, so as to prevent substrate injection occurring from the drain of said second DMOS transistor to surrounding isolation regions in the event of the output terminal going below ground due to the action of external circuitry.

8. The gate driver of claim 2 wherein said predrive circuitry connected to the base of said first NPN transistor comprises third and fourth NMOS transistors, the drain of said third NMOS transistor connected to said supply terminal, the source of said third NMOS transistor connected to the drain of said fourth NMOS transistor and to the base of said first NPN transistor, the source of said fourth NMOS transistor connected to ground, and the gates of said third and fourth NMOS transistors connected to circuitry operable to either turn on or turn off said first bipolar transistor in response to the signal at said control terminal.

9. The gate driver of claim 8, further comprising a first PMOS transistor, wherein the source of said first PMOS transistor is connected to said supply terminal, the drain of said first PMOS transistor is connected to the base of said first NPN transistor, and the gate of said first PMOS transistor is connected to circuitry operable to either turn on or turn off said first bipolar transistor in response to a signal at said control terminal, said PMOS transistor operable to provide additional base drive to said first NPN transistor when said third NMOS transistor loses drive due to inadequate gate-to-source bias, the connection of said first PMOS transistor further operable to allow the use of a low-voltage, high-transconductance MOS transistor due to the clamping action of said first diode.

10. The gate driver of claim 2, further comprising a fifth NMOS transistor and a second PMOS transistor, wherein the source of said second PMOS transistor is connected to said supply terminal, the drain of said second DMOS transistor is connected to said gate drive circuitry and to the drain of said fifth NMOS transistor, the source of said fifth NMOS transistor is connected to ground, and the gates of said second PMOS transistor and said fifth NMOS transistor are connected to circuitry operable to sink or source current to said gate drive terminal when inadequate base-emitter voltage can be obtained by one of said first NPN transistor or said second NPN transistor to prevent the gate drive output from drifting from one of ground or the voltage of said source terminal.

11. The gate driver of claim 10, further including a capacitor connected between said supply terminal and said output terminal, a second diode having an anode and a cathode, said anode connected to a first voltage supply and the cathode connected to said supply terminal, and a power MOS transistor, the gate of said power MOS transistor connected to said gate drive terminal, the source of said power MOS transistor connected to said output terminal and the drain of said power MOS transistor connected to a second voltage supply, such that said capacitor receives charge through said second diode when said power MOS transistor is disabled and said capacitor supplies charge to said gate driver when said power MOS transistor is enabled.

12. The gate driver of claim 11 wherein said second PMOS transistor is a low-voltage high-transconductance PMOS transistor, the drain-to-source breakdown voltage of said second PMOS transistor being greater than the potential of said first voltage source and one of less than or greater than the potential of said second source.

\* \* \* \* \*